(12) United States Patent
Hiroshima

(10) Patent No.: US 7,438,998 B2
(45) Date of Patent: Oct. 21, 2008

(54) METHOD OF MANUFACTURING SEMICONDUCTOR DEVICE

(75) Inventor: Masahito Hiroshima, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 187 days.

(21) Appl. No.: 10/956,142

(22) Filed: Oct. 4, 2004

(65) Prior Publication Data

US 2005/0084806 A1 Apr. 21, 2005

(30) Foreign Application Priority Data

Oct. 3, 2003 (JP) ............................. 2003-345939

(51) Int. Cl.
*G03F 7/00* (2006.01)
(52) U.S. Cl. ...................... 430/5; 430/311; 430/312; 430/313
(58) Field of Classification Search ................ None
See application file for complete search history.

(56) References Cited

U.S. PATENT DOCUMENTS

| 4,837,176 | A | * | 6/1989 | Zdebel et al. ............... 438/552 |
| 5,959,325 | A | * | 9/1999 | Adair et al. ................. 257/302 |
| 6,598,218 | B2 | * | 7/2003 | Lin ............................. 716/21 |
| 2002/0177078 | A1 | * | 11/2002 | Blatchford et al. ........... 430/313 |
| 2004/0161707 | A1 | * | 8/2004 | Hasegawa et al. ........... 430/311 |

FOREIGN PATENT DOCUMENTS

| JP | 62-141558 | | 6/1987 |
| JP | 3-89347 | | 4/1991 |
| JP | 7-248612 | | 9/1995 |
| JP | 10142769 | * | 5/1998 |
| JP | 2000-47366 | | 2/2000 |

* cited by examiner

*Primary Examiner*—John A. McPherson
*Assistant Examiner*—Daborah Chacko Davis
(74) *Attorney, Agent, or Firm*—Young & Thompson

(57) ABSTRACT

In a method of manufacturing a semiconductor device including a wiring pattern in the form of a linear line having an intermediate portion with a locally different line width, the wiring pattern being formed by using a resist pattern, the resist pattern is formed through an exposure step using a mask pattern prepared by dividing the wiring pattern in a mask into a simple line portion and a rectangular pattern portion having a different line width, and interposing between the line portion and the rectangular pattern portion a slit having a predetermined separation width of not larger than $0.22 \times \lambda/NA$ ($\lambda$ represents a wavelength of exposure light, and NA represents a numerical aperture of a projection lens).

6 Claims, 11 Drawing Sheets

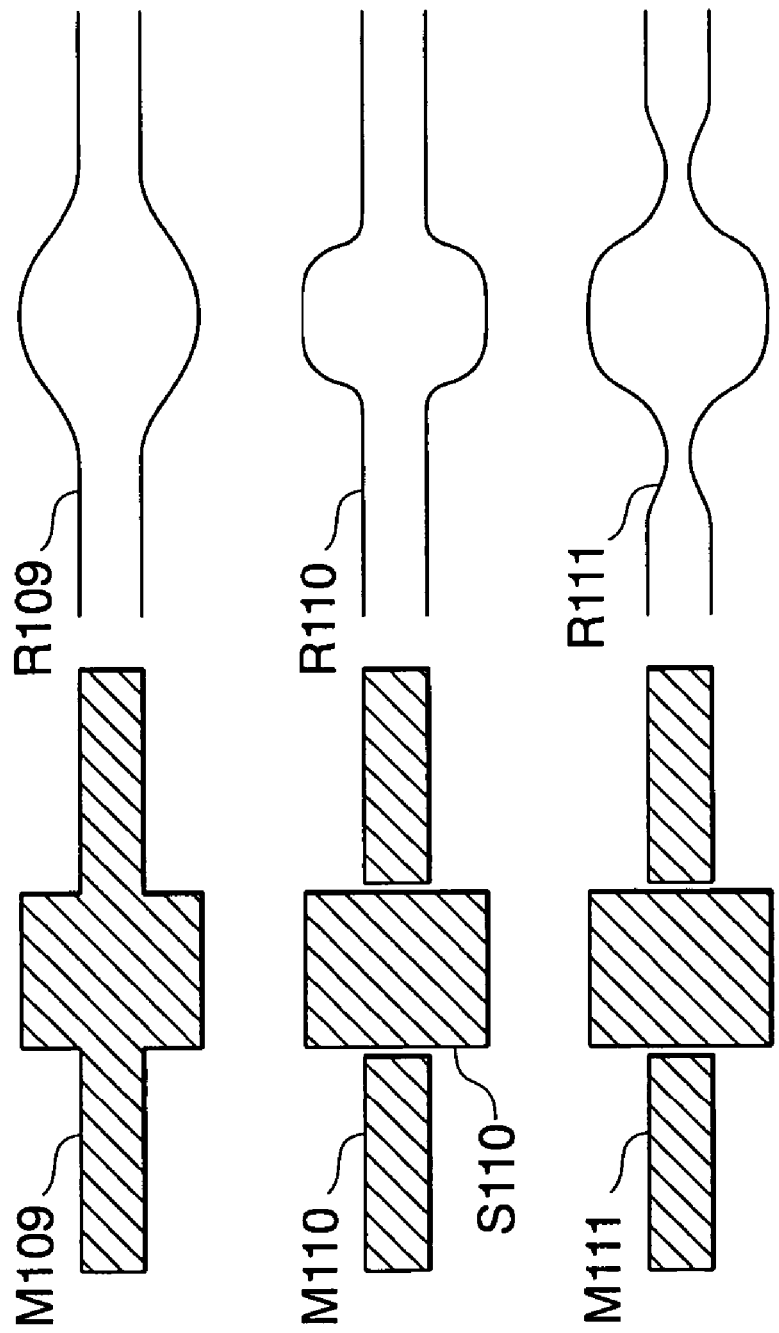

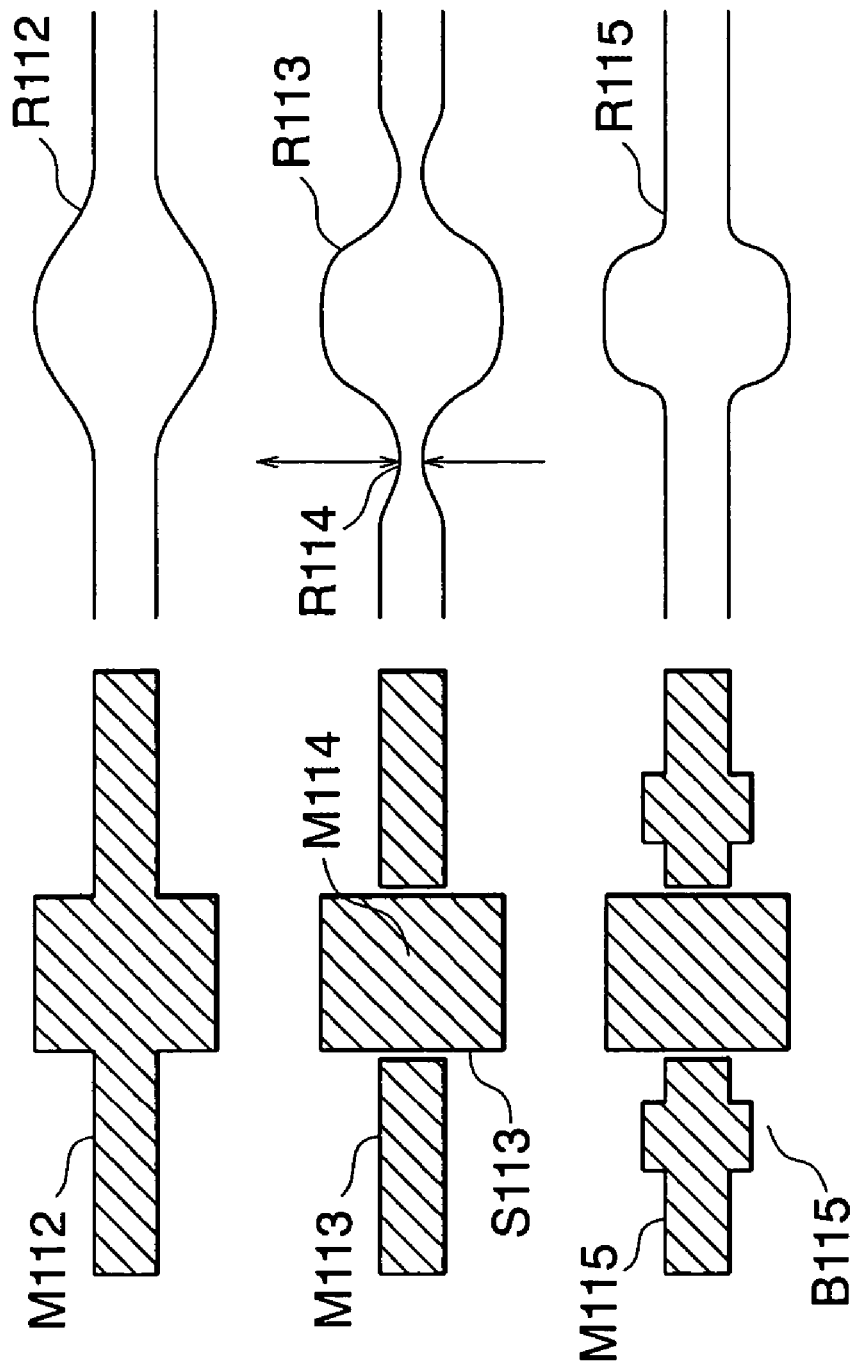

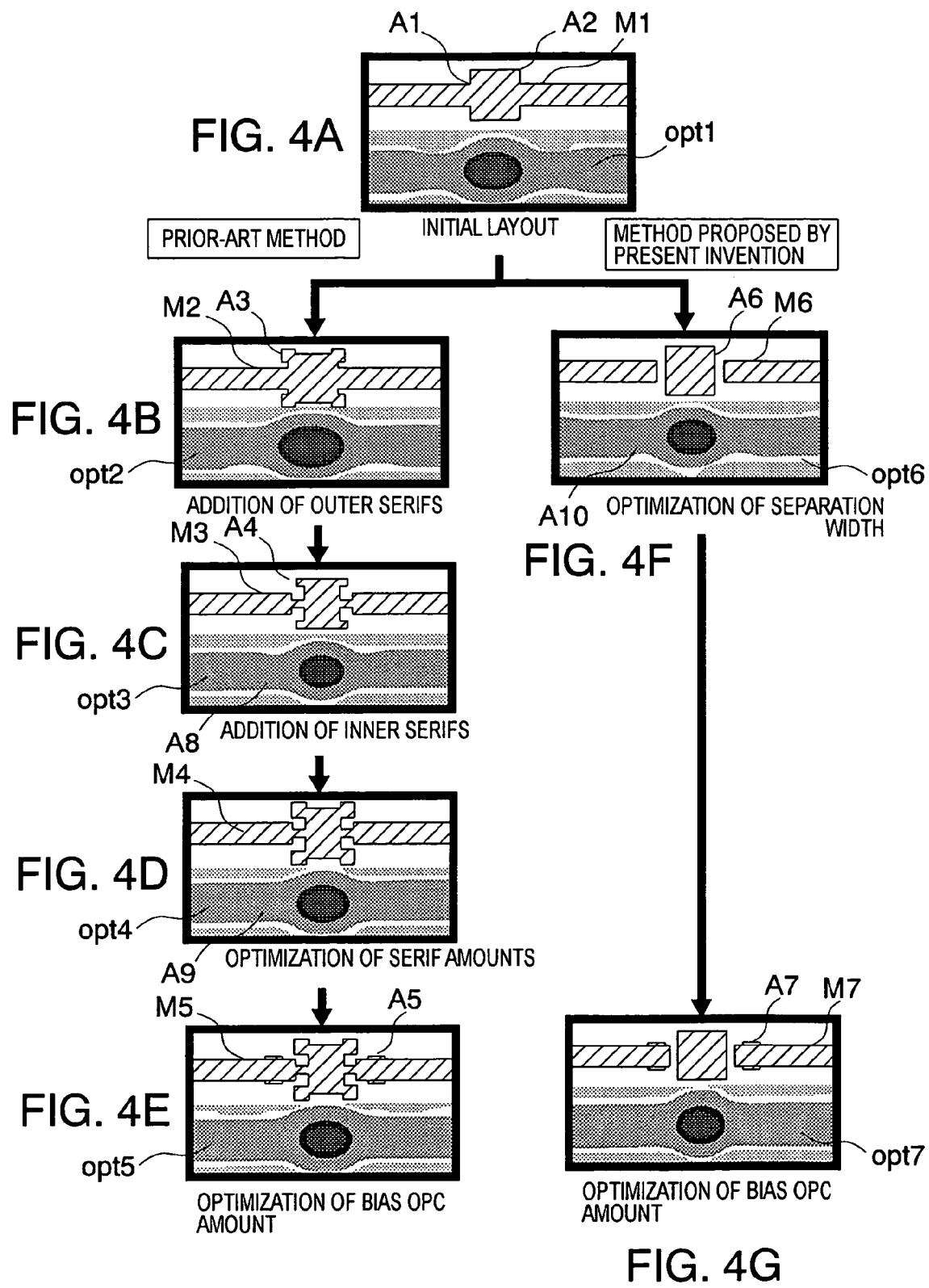

METHOD OF MANUFACTURING SEMICONDUCTOR DEVICE

This application claims priority to prior application JP2003-345939, the disclosure of which is incorporated herein by reference.

BACKGROUND OF THE INVENTION

The present invention relates to a method of manufacturing a semiconductor device, and more particularly to a method of manufacturing a semiconductor device so as to increase process performance based on optimization of a mask layout in the lithography process of a semiconductor manufacturing method.

Transfer of a pattern to a resist is performed through the steps of irradiating coherent light to the so-called photomask, i.e., a glass plate having a device pattern of a light shield material formed on a glass substrate, and then projecting the diffracted light having passed through the photomask onto the resist in the same or reduced size by a projection lens. An optical image of the projected light causes a photochemical reaction in the resist to produce a difference in solubility with a developing solution between an irradiated area and a non-irradiated area. Such a difference provides a dissolution contrast in the developing step, thereby forming the device pattern in the resist. Therefore, the optical image projected onto the resist greatly affects the accuracy of a final resist pattern.

The transfer of the mask pattern to the resist is performed by utilizing optical characteristics of the projected light. As a consequence, an unintended pattern is possibly transferred to the resist due to light interference depending on the mask pattern. That phenomenon appears when the pattern size is very fine. More specifically, when two adjacent patterns on a mask are arranged near or under a resolution limit, a resolution capability is not sufficient to separate the two patterns from each other. Therefore, the diffracted lights having passed through the two patterns interfere with each other so that the patterns are joined together on the resist. Further, the interference of projected and diffracted light similarly appears and an optical image is moderately curved in or near an area of a wiring pattern where the pattern bends at an internal angle of not larger than 180° (or at an external angle of not smaller than 180°) or where the pattern has a different line width. Accordingly, rectangularity deteriorates in an inwardly angled area of the resist pattern. Such a deterioration of the transfer accuracy may cause serious defects, e.g., an increase of parasitic resistance and capacity in wiring and gate portions, a decrease of driving performance of transistors, and an increase of contact resistance due to a contact failure at a via for connection to an upper wiring layer.

In order to improve fidelity in transfer of a mask pattern, the mask pattern has hitherto been corrected by a method of estimating expected light interference and subtracting, on the mask pattern, the displacement of a transferred optical image caused by the interference in advance. That process is called OPC (Optical Proximity Effect Correction).

FIGS. 1A through 1D illustrate several methods for reflecting, on the mask pattern, the displacement of an optical image caused by the interference in advance. A correction pattern having a specific shape is added for the purpose of correction in examples shown in FIGS. 1A-1D. The examples include the case of applying a mask bias to a relevant area (as indicated by an original mask pattern M100 and a bias pattern M101), the case of preventing contraction at ends (as indicated by an original mask pattern M102 and an OPC correction pattern M103), and the case of improving rectangularity of angled corners (as indicated by an original mask pattern M104 and an OPC correction pattern M105). Another general method arranges a non-resolvable assist pattern S110 (as indicated by an original mask pattern M106 and OPC correction patterns M107, M108) to adjust periodicity in a pattern array and to provide more advantageous conditions from the viewpoint of process.

Still another method is further proposed which forms a slit having a non-transferable width at an inwardly angled portion of a mask pattern for wired lines including angled corners to suppress the light interference at the inwardly angled portion so that the resist pattern is prevented from unintentionally curving in the inwardly angled portion (see, e.g., Patent Reference 1; Japanese Unexamined Patent Application Publication No. 62-141558 (FIG. 1)).

In a mask pattern for wired lines including angled corners with a local difference in line width, transfer accuracy deteriorates near an inwardly angled portion of the mask pattern, and unintentional curving of the resist pattern appears at the inwardly angled portion. Therefore, such an inwardly angled portion is a target area for which the correction is to be made on the mask (as indicated by images of a mask pattern M109 and a resist pattern R109 in FIG. 2A). According to the known method, the OPC is performed by forming the OPC correction pattern M107 shown in FIG. 1D. Further, in case where the correction method proposed in the above-cited Patent Reference 1 is used (as indicated by a mask pattern M110 in FIG. 2B), the transferred shape of a resist is improved as indicated by a resist pattern R110 in FIG. 2B, and the resist pattern curves more sharply in the inwardly angled portion.

However, in case where the mask pattern is an ultra-fine pattern having a scale so small as not larger than about ½ of the wavelength of exposure light used in an optical stepper, correction accuracy is very difficult to standardize. For this reason, a sufficient level of the accuracy cannot be obtained with the OPC correction pattern M107 that is used in the known method and shown in FIG. 1D. The mask pattern M110 shown in FIG. 2B is expected to provide a higher correction effect than the OPC correction pattern M107 shown in FIG. 1D. In the case employing high-resolution exposure conditions to resolve the ultra-fine pattern, however, a portion of very low light intensity appears near the inwardly angled portion due to excessive interference in the slit position, and the line width is extremely narrowed, thus leading to a line break (see a mask pattern M111 and a resist pattern R111 in FIG. 2C).

Even when a slit is formed in width at a level not affecting resolution, the slit includes an area where satisfactory transfer accuracy is not obtained, and an area where excessive interference promotes degradation of a transferred image. Therefore, the formation of the slit is very difficult in practicing the transfer of ultra-fine patterns.

Thus, the known methods of forming fine patterns have problems given below.

First, the accuracy of pattern transfer to a resist significantly deteriorates in an angled portion of a mask pattern for wired lines including angled corners with a local difference in line width. The reason is that diffracted lights interfere with each other in the angled portion, and consequently, the light contrast of a transferred optical image reduces.

Secondly, the known mask correction based on the OPC requires a lot of time and labor for calculating an optimum OPC correction amount. The reason is that an OPC correction pattern formed in the angled portion is a small 2D (two-dimensional) rectangular pattern, but a large number of combinations of parameters must be studied because a total of three parameters exist, i.e., length and width in addition to a position where the pattern is arranged.

Thirdly, when the mask pattern is an ultra-fine pattern having a scale so small as not larger than about ½ of the wavelength of exposure light used in an optical stepper, a sufficient level of transfer accuracy cannot be obtained with an OPC correction pattern of the known type added to a main pattern. The reason is that the ultra-small scale requires a very high level of correction accuracy. Further, since dimensions of the added OPC correction pattern are also much smaller than those of the main pattern, it is difficult to form an excellent correction pattern on the photomask, and consequently, a sufficient correction effect cannot be stably obtained.

Fourthly, in some cases, an ultra-fine line pattern has a scale so small as not larger than about ½ of the wavelength of exposure light used in an optical stepper and includes an angled portion. In those cases, even when a slit not resolvable on the photomask is formed so as to increase the transfer accuracy near the angled portion, an area having a very low light contrast appears near the angled portion, and a transferred pattern is often broken. The reason is that the diffracted lights having passed through the photomask tend to easily interfere with each other because the optical stepper used for resolving the ultra-fine pattern has very high performance. Therefore, even a slit having a width as small as not resolvable may rather lead to deterioration of the transfer accuracy in practice depending on the pattern dimensions.

Fifthly, even when a slit is formed in width at a level not affecting resolution, the slit includes an area where satisfactory transfer accuracy is not obtained, and an area where excessive interference promotes degradation of a transferred image. As a consequence, the formation of the slit is very difficult in practicing the transfer of ultra-fine patterns. The reason is that because the optical stepper used for resolving the ultra-fine pattern has very high performance, the optical image near the slit is adversely affected even with the slit having a very small width unless the slit width is optimized.

SUMMARY OF THE INVENTION

It is therefore an object of the present invention to transfer an ultra-fine line pattern having a scale so small as not larger than about ½ of the wavelength of exposure light used in an optical stepper with high accuracy even in inwardly and outwardly angled portions of corners angled with a local difference in line width. The term "accuracy" used herein means a degree of rectangularity resulting when a pattern formed in a photomask and having a rectangularly angled portion is transferred to a resist so as to achieve fidelity as high as possible in practice.

It is another object of the present invention to realize a correction process capable of more simply achieving high correction accuracy with optimization of only a minimum number of parameters.

In a method of manufacturing a semiconductor device according to the present invention, a wiring pattern (mask layout) in the form of a line including angled portions with a local difference in line width is divided into rectangular patterns each having a large area and node portions interconnecting the rectangular patterns. In this event, the node portion and the rectangular pattern are separated from each other by a slit having a width within a dimensional range of not larger than 0.22×λ/NA. Herein, λ represents the wavelength of exposure light, and NA represents the numerical aperture of a projection lens. Such a mask pattern is transferred to form a continuous wiring pattern with joint of the separated original patterns on an optical image through a projection process. As a result, improved optical images are obtained in corners of the rectangular pattern and its areas adjacent to the node portions where a significant deterioration of transfer accuracy has occurred in the past. On the other hand, an area having a very low light contrast is produced near the angled portion. This extreme narrowing of the pattern is corrected by applying a bias correction in the form of a bias pattern to a position on the mask layout corresponding to the area having a very low light contrast. The transfer accuracy can be therefore maximally increased in the angled portion and thereabout.

Thus, the use of the mask pattern prepared according to the above-described method can realize highly accurate transfer, to a resist, of the wiring pattern in the form of a line including angled portions with a local difference in line width, and therefore a device can be manufactured which is in match with the device pattern image assumed at the time of device design. Consequently, highly functional design can be achieved while process variations are held within a minimum range.

Since very high transfer accuracy is obtained for an ultra-fine line pattern having a scale so small as not larger than about ½ of the wavelength of exposure light used in the optical stepper, the method of the present invention can be effectively applied to manufacturing of a highly integrated memory device or logic device having an ultra-fine wiring pattern.

As compared with the known OPC methods, the mask correction method of the present invention can provide the following advantages in optimization of the dimensional correction amount and the OPC correction amount for a mask pattern. A smaller number of parameters are to be studied in design, and therefore the optimization can be greatly facilitated, which minimizes time and labor required for optimizing process conditions.

Moreover, in case where the known OPC correction pattern of the type added to an original pattern is used for an ultra-fine line pattern having a scale so small as not larger than about ½ of the wavelength of exposure light used in the optical stepper, the known OPC method requires the size and shape which are very hard to control in manufacturing of a mask, and therefore has a difficulty in realizing practical use. In contrast, the mask correction method according to the present invention employs a slit and a simple bias, which can be easily incorporated in even a mask having a very small scale. Therefore, the method of the present invention can easily ensure satisfactory dimensions and external appearance in the mask manufacturing stage, and has high versatility for ultra-fine patterns in any generations.

BRIEF DESCRIPTION OF THE DRAWINGS

FIG. 2A through 2C are illustrations for explaining a mask correction method using a not-transferable slit and a problem with the method;

FIGS. 3A through 3C are illustrations for explaining a novel mask correction method for an ultra-fine pattern according to one embodiment of the present invention;

FIGS. 4A through 4G are illustrations for comparing mask layout optimization processes according to the prior art and the present invention;

FIGS. 5A and 5B represent a scheme for studying a separation width settable range obtained with the mask layout process according to the present invention, in which FIG. 5A shows points for monitoring dimensions and FIG. 5B is a graph indicating a line width contrast resulting when a separation width is changed;

FIGS. 10A through 10D are illustrations for explaining the mask pattern optimization process in the example of FIG. 8, in which FIG. 10A shows an original mask layout and a resist image, FIG. 10B shows extraction of a rectangular portion and a node portion, FIG. 10C shows a mask layout and a resist image, and FIG. 10D shows a final mask layout and a resist image.

DESCRIPTION OF THE PREFERRED EMBODIMENTS

Figure 1A:
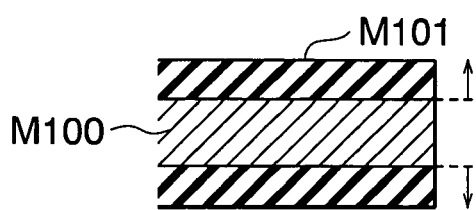
FIG. 1A through 1D are illustrations for explaining various known OPC methods.
Figure 1C:
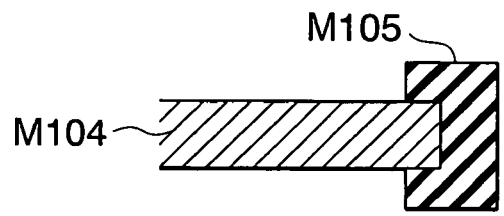
Figure 1B:
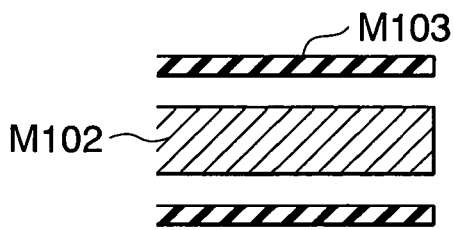
Figure 1D:
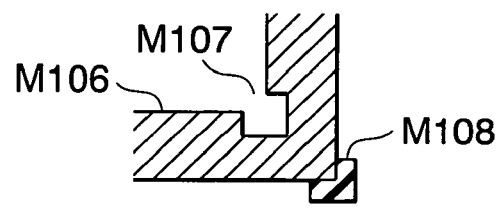

An embodiment of the present invention will be described below with reference to the drawings.

Referring to FIGS. 3A through 3C, description will be made of a mask correction method for an ultra-fine pattern according to one embodiment of the present invention.

The method of the present invention is applied to a wiring pattern (original mask layout pattern) M112 (see FIG. 3A) in the form of a line including angled portions with a local difference in line width. As shown in FIG. 3B, the original mask layout pattern M112 is divided into a rectangular pattern M114 having a large area and node portions M113 for connection of the rectangular pattern M114. In this case, as shown in FIG. 3B, the node portion M113 and the rectangular pattern M114 are separated from each other by a slit S113 having a width within a dimensional range of not larger than $0.22 \times \lambda/NA$. It is noted here that $\lambda$ represents the wavelength of exposure light, and NA represents the numerical aperture of a projection lens. Such a mask pattern is transferred so as to form a continuous wiring pattern (resist shape image) R113, as shown in FIG. 3B, with joint of the separated original patterns on an optical image through a projection process. As a result, improved optical images are obtained in corners of the rectangular pattern and its areas adjacent to the node portions where a significant deterioration of transfer accuracy has occurred in the past.

On the other hand, as shown in FIG. 3B, an area having a very low light contrast (i.e., an extremely narrowed resist area) R114 is produced near the angled portion. This extreme narrowing of the pattern is corrected, as shown in FIG. 3C, by applying a bias correction in the form of a bias pattern B115 to a corresponding position on the mask layout. As a consequence, the transfer accuracy can be maximally increased in the angled portion and thereabout.

Thus, the use of the mask pattern prepared according to the above-described method can realize highly accurate transfer, to the resist, of the wiring pattern in the form of a line including angled portions with a local difference in line width, and therefore a device can be manufactured which is in match with the device pattern image assumed at the time of device design. Consequently, highly functional design can be achieved while process variations are held within a minimum range.

Since very high transfer accuracy is obtained for an ultra-fine line pattern having a scale so small as not larger than about ½ of the wavelength of exposure light used in the optical stepper, the method of the present invention can be effectively applied to manufacturing of a highly integrated memory device or logic device having an ultra-fine wiring pattern.

With reference to FIGS. 4A to 4G, a description is now made of mask layout optimization processes according to the method of the present invention and the prior-art method for comparison between them.

As shown in FIG. 4A, an original mask pattern M1 is assumed to be a wiring pattern in the form of a line including angled portions with a local difference in line width. When the original mask pattern M1 is formed as an ultra-fine pattern in a photomask and is transferred to a resist by using an optical stepper having high resolution performance, an optical image is obtained as indicated by opt1. In the optical image opt1, a contrast deteriorates in angled portions A1 where the line width changes and at corners A2 of a wide rectangular portion. Therefore, a profile of the optical image moderately curves in the angled portions A1 and at the corners A2.

A description is first made of the case in which the prior-art mask correction method is applied to the original mask pattern M1. In this case, as shown in FIG. 4B, a first correction mask pattern M2 is obtained by adding serif patterns M3 to the corners A2 of the rectangular portion of the original mask pattern M1 so that a correction amount is optimized to improve the rectangularity at each corner of the rectangular portion. As a result, an optical image opt2 is obtained. However, a sufficient level of transfer accuracy cannot be obtained because the optical image becomes blunt in the angled portions adjacent to the line portion.

In contrast to the first correction mask pattern M2, as shown in FIG. 4C, a second correction mask pattern M3 is obtained by adding reversed serif patterns A4 to the inwardly angled portions of the original mask pattern M1 so that a correction amount is optimized to improve the rectangularity in the inwardly angled portions. As a result, an optical image opt3 is obtained. The second correction mask pattern M2 contributes to improving the rectangularity in the rectangular portion, but the optical image opt3 is significantly narrowed in areas denoted by A8.

Then, as shown in FIG. 4D, the serif patterns A3 and the reversed serif patterns A4 are optimized again by combining the two first and second correction mask patterns M2, M3 obtained by the above-described optimizations based on the OPC method, and calculating respective optimum correction amounts of those mask patterns in the combined state. This results in a third correction mask pattern M4, which produces an optical image opt4. The optical image opt4 is similarly narrowed in areas denoted by A9.

In a final stage, as shown in FIG. 4E, a final correction mask pattern M5 is completely formed by adding, to the third correction mask pattern M4, a bias correction in each of positions corresponding to the narrowed areas of the optical image opt4 as indicated by A5.

By comparison, a description is now made of the case of applying the mask correction method newly proposed by the present invention. In this case, as shown in FIG. 4F, a main correction mask pattern M6 is prepared by adding, to the original mask pattern M1 shown in FIG. 4A, a slit A6 at each boundary where the line width changes, so that a continuous line pattern is formed with joint of the separated original patterns on an optical image through a projection process. Herein, the width of the slit is set to a value selected from a predetermined range at which the desired pattern shape is obtained. As a result, a shape closer to a rectangle can be realized in an optical image opt6. As shown in FIG. 4F, however, the light contrast reduced significantly in areas denoted by A10. In a final stage, as shown in FIG. 4G, a final correction mask pattern M7 is formed by adding, to the main correction mask pattern M6, a bias correction pattern A7 in each of positions corresponding to the areas where the light contrast significantly reduces. An optical image opt7 having a better profile is obtained by using the finally corrected mask pattern M7.

Thus, the mask correction method according to the present invention can more easily realize the correction accuracy in the final stage comparable to a level obtained with the pattern formed based on the known OPC methods that require several complicated correction steps.

Figure 5A:
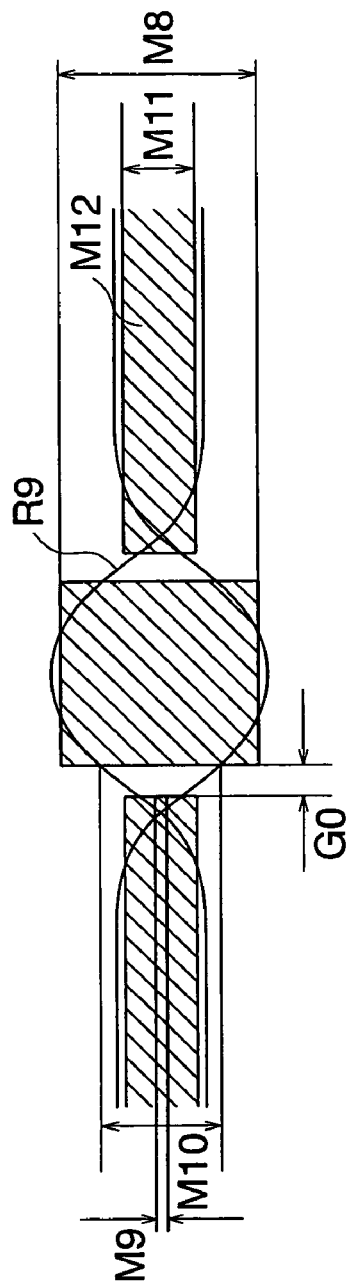

A separation width settable range will be described below with reference to FIGS. 5A and 5B. FIG. 5A shows points for monitoring dimensions, and FIG. 5B is a graph indicating a line width contrast resulting when a separation width is changed.

The width of the formed slit must be optimized in order to obtain the desired result. In a mask layout M12 shown in FIG. 5A, image sizes of an optical image R9 were calculated for various corresponding portions, i.e., a dog-bone maximum diameter portion M8, a minimum line width portion M9, a mask angled portion M10, and a line portion M11. Based on those dimensions, the line width contrast was calculated from the definition of (image size of the dog-bone maximum diameter portion M8)/(image size of the mask angled portion M10). Accordingly, the line width contrast increases under the condition providing an optical image having a higher degree of rectangularity in the angled portion near a dog bone.

Figure 5B:
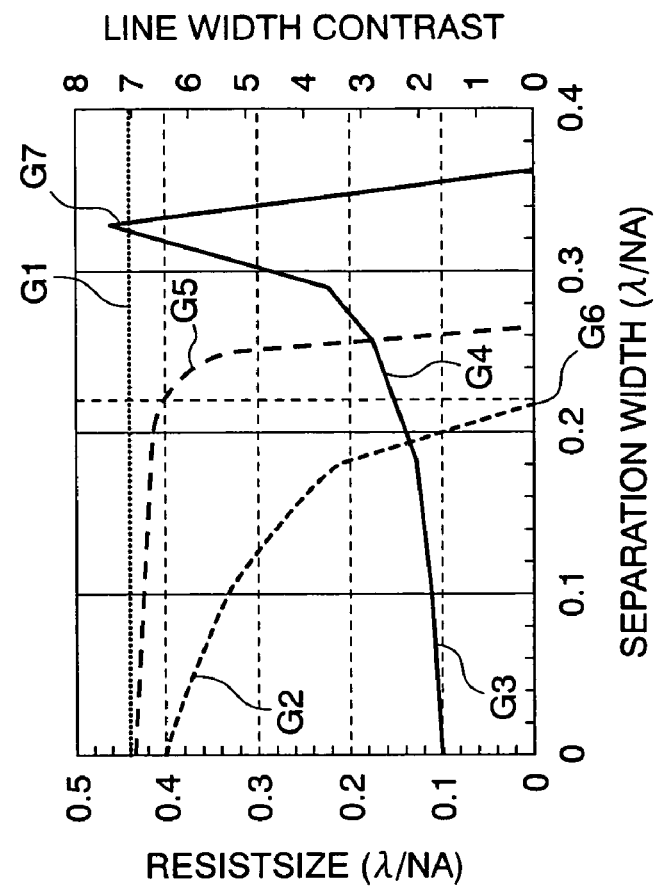

The thus-calculated results are plotted, as shown in FIG. 5B, in terms of changes in the line width contrast G3, a minimum line width portion size G2, and a line portion size G1 resulting when the slit (separation) width G0 is varied. The plotted dimensional characteristics were standardized with the wavelength $\lambda$ of exposure light and the aperture number NA of the projection lens being parameters in unit on the order of nanometer so as to provide versatility under various exposure conditions.

As illustrated in FIG. 5B, as the slit width G0 increases, the line width contrast G3 of the projected optical image also increases. However, the line width contrast reaches a maximum, as indicated by G7, when the separation width G0 is 0.33 $\lambda$/NA. When the line width contrast exceeds G7, the pattern is split in the mask angled portion M10, and therefore, the line width contrast reduces abruptly.

On the other hand, the optical image size G2 of the minimum line width portion M9 represents an area having minimum intensity of light, i.e., a point where excessive light interference occurs due to the insertion of the slit, and the optical image size G2 tends to narrow exponentially as the slit width G0 increases. As a result, when the slit width G0 is 0.22 $\lambda$/NA, the line width becomes zero and the optical image is virtually split. Thus, splitting of the pattern starts at a limit point G6 corresponding to the slit width of 0.22 $\lambda$/NA, and the limit point G6 provides an allowable upper limit value in a range within which the slit width G0 is definable from the viewpoint of process. In other words, the line width contrast G4 at the limit point G6 can be considered as providing a maximum value virtually allowable from the viewpoint of process and as specifying the condition under which rectangularity is maximized within a practicable range. Based on the above discussion, an excellent optical image with a very high degree of rectangularity can be obtained by setting the optimum separation width to a value equal to or not larger than 0.22 $\lambda$/NA.

In a final stage, a local correction bias is applied to the mask layout pattern M12 in each position corresponding to the minimum line width portion M9 shown in FIG. 5A. A high-resolution exposure apparatus and illumination conditions are used in a projection step of the fine wiring pattern for the purpose of improving rectangularity of the optical image due to the insertion of the slit. The use of those exposure apparatus and illumination conditions, however, implies an increase of the light interference and is more apt to cause multiple interference near the mask angled portion. In the wiring layout according to the present invention, multiple interference occurs in the dog-bone maximum diameter portion M8, shown in FIG. 5A, near the slit in a concentrated way. Accordingly, the intensity of light significantly lowers in the dog-bone maximum diameter portion M8 shown in FIG. 5A, and the line width is extremely narrowed in a corresponding portion of the traced resist shape.

Figure 6:
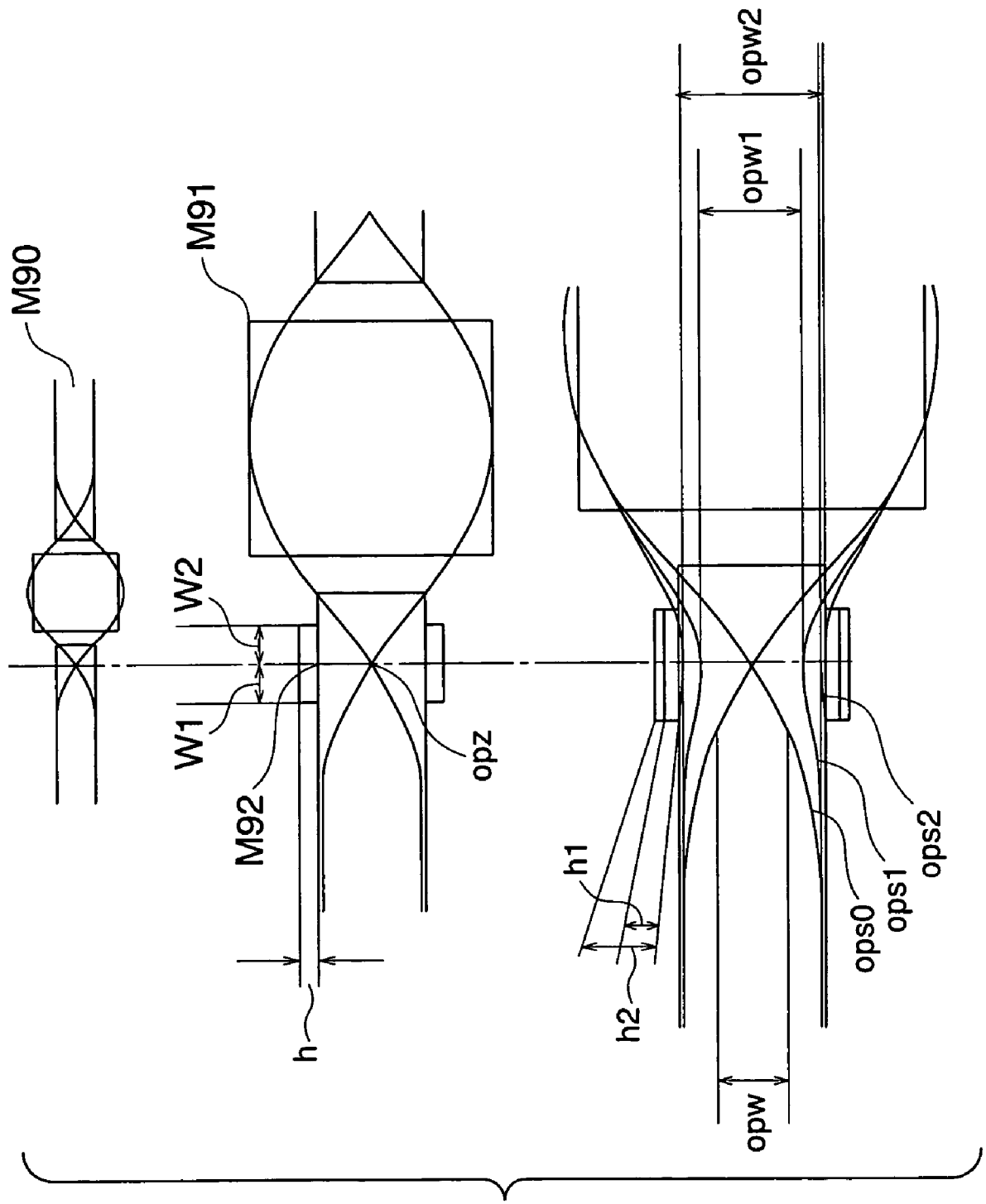
FIG. 6 is a set of illustrations for explaining the novel mask correction method for the ultra-fine pattern shown in FIG. 3.

In view of the above point, the lowered intensity of light is compensated by adding a bias pattern M92 to the mask layout in a position corresponding to an excessive interference portion opz of the mask layout as shown in FIG. 6. The bias pattern M92 has respective lengths W1, W2 on the left and right sides about a line perpendicularly extending from a base point defined as the excessive interference portion opz of the mask layout, and the bias pattern M92 has a height h. The lengths W1, W2 are set so as to satisfy W1+W2=0.27 $\lambda$/NA on an assumption that the initial lengths W1, W2 correspond to ½ of the slope in the optical image curving as indicated by ops0 when the height h is zero. Then, the relationship between the height h and an image size opw was examined with only the height h being a parameter. FIG. 6 shows respective line widths opw1, opw2 of optical images ops1, ops2 resulting when the height is set to h1, h2.

Figure 7:
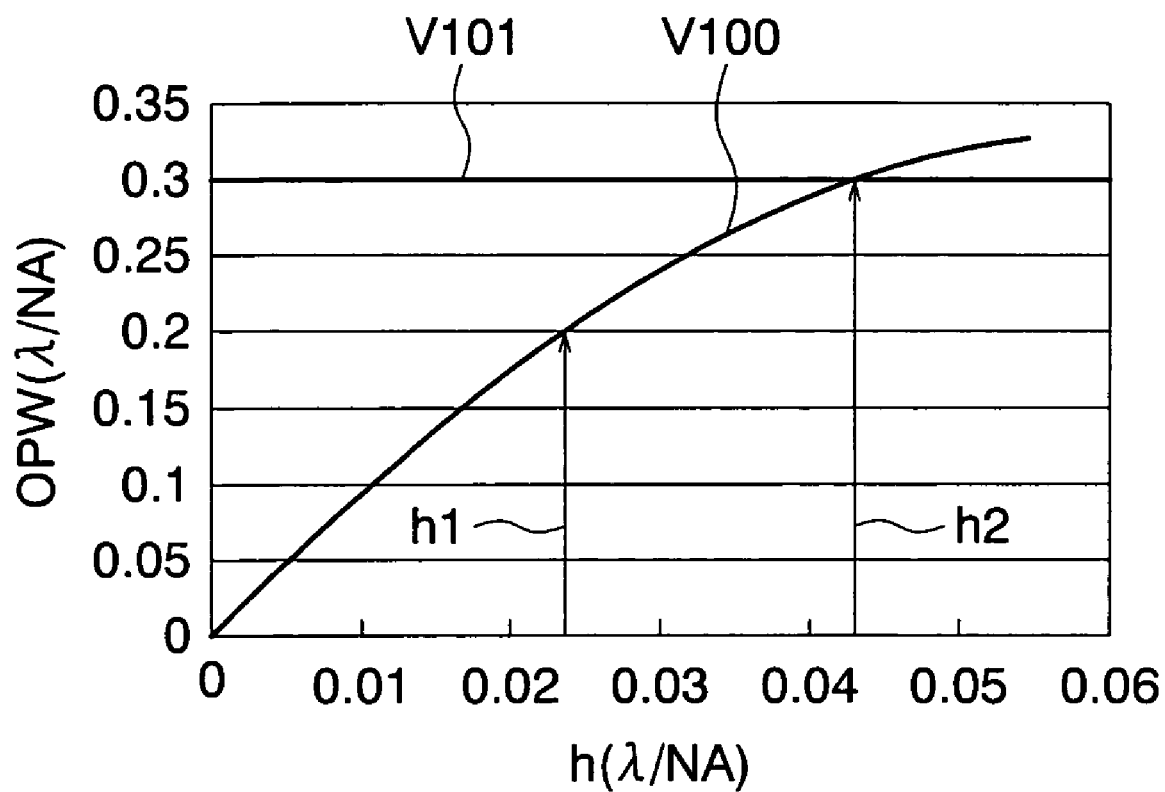
FIG. 7 is a characteristic graph showing the relationship between the height of a bias pattern shown in FIG. 6 and an image size.

The target height h of the bias pattern M92 can be optimized from a characteristic graph shown in FIG. 7. The characteristic graph shown in FIG. 7 plots a size change V100 of the minimum line width opw when the height h shown in FIG. 6 is varied from 0 to 0.06 $\lambda$/NA. As seen from FIG. 7, an optimum OPC amount is given by the height h2 at which the image size opw becomes equal to a line width V101 of the line portion when the height h is arbitrarily varied. Thus, a series of steps for correcting the excessive interference portion caused by the insertion of the slit are completed by arranging the bias pattern M92 with the width W1+W2 and the height h2 on each of opposite sides of the excessive interference portion.

Figure 8A:
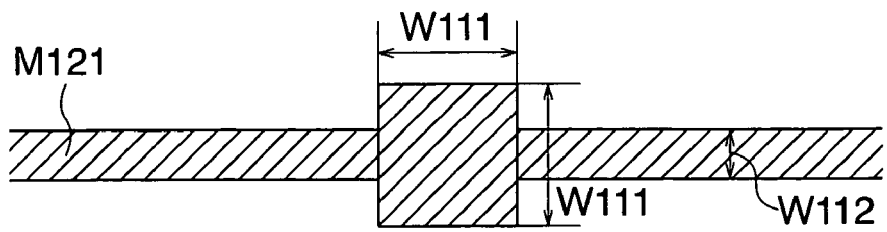
FIGS. 8A through 8E are illustrations for explaining an example in which the method of the present invention is applied to a device pattern.
Figure 8B:
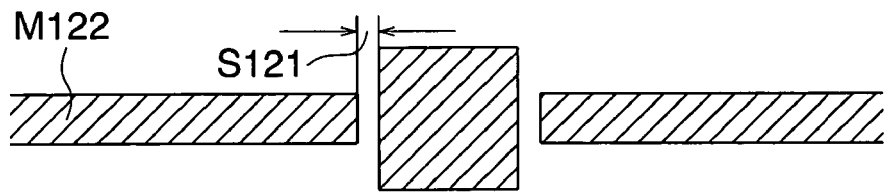
Figure 8C:
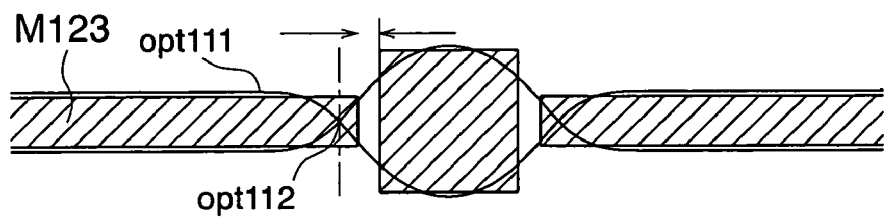
Figure 8D:
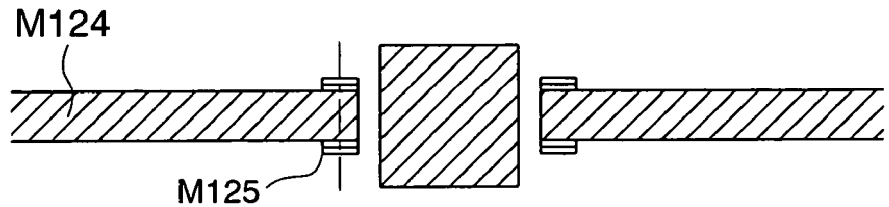
Figure 8E:
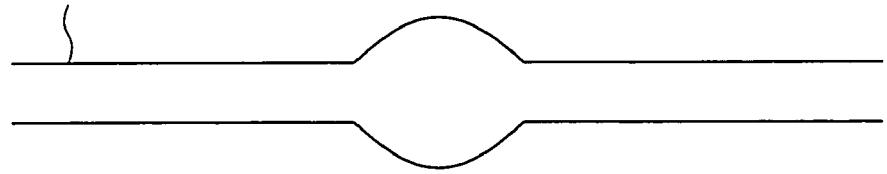
Figure 9:
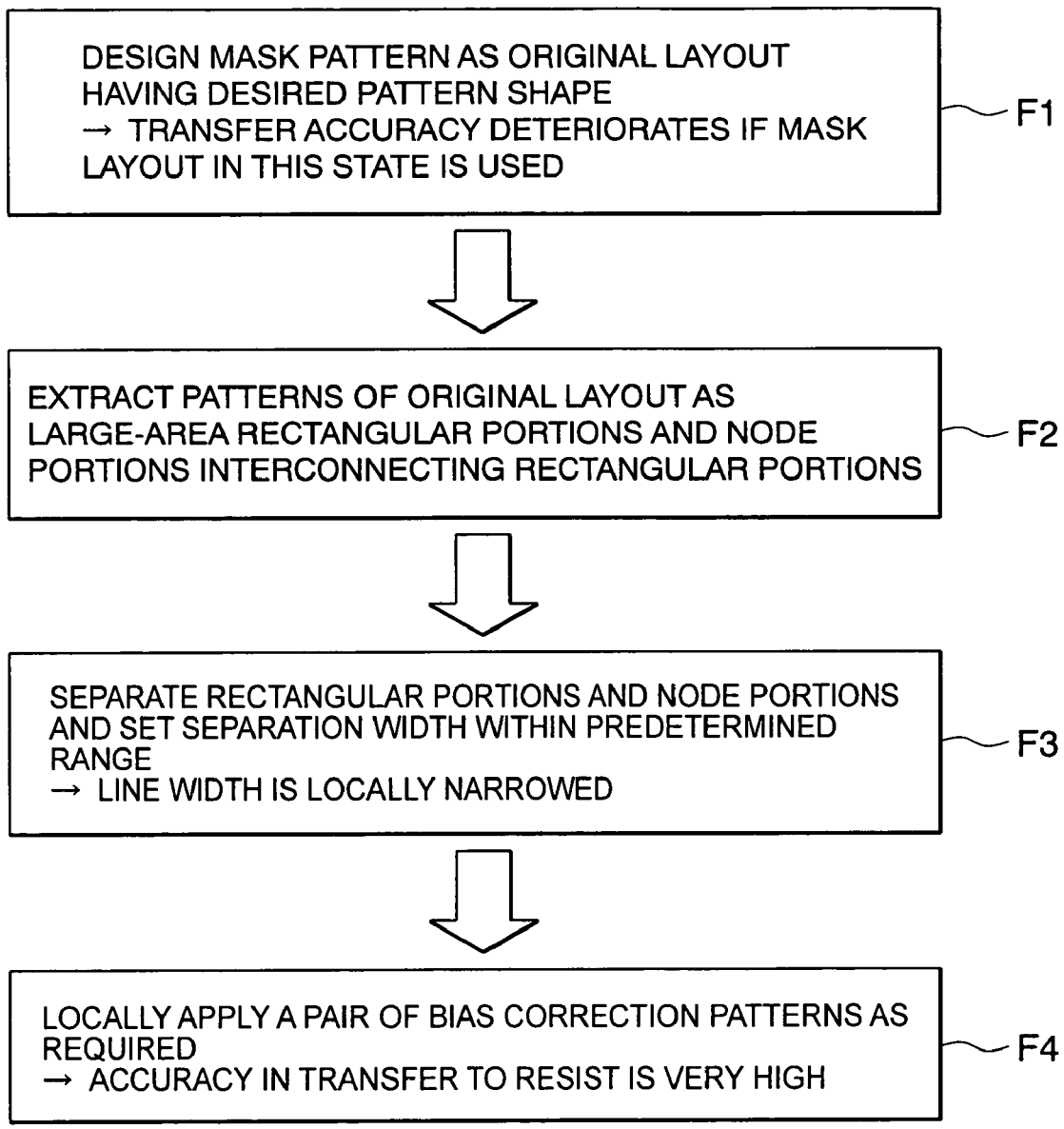
FIG. 9 is a flowchart for explaining a mask pattern optimization process in the example of FIG. 8.
Figure 10:
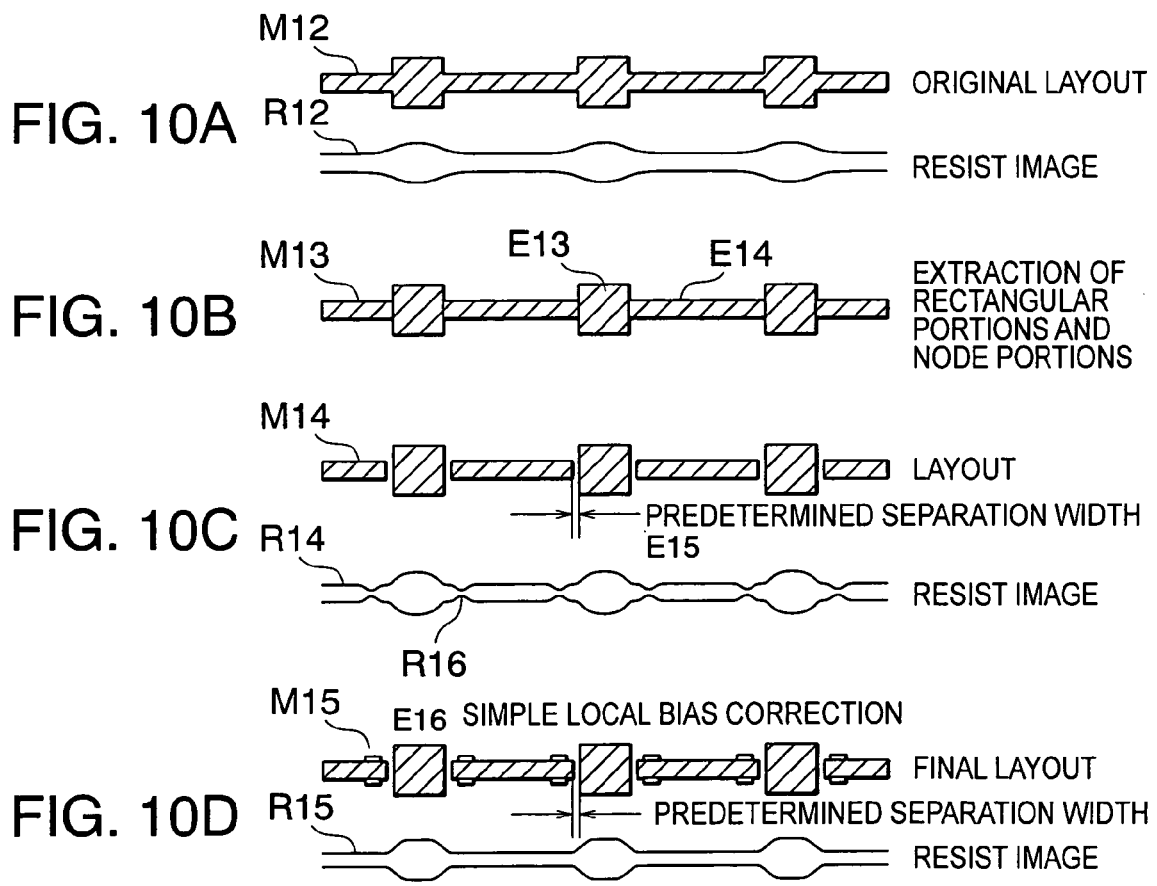

With reference to FIGS. 8, 9 and 10, a description is now made of an example in which the present invention is applied to a device circuit pattern of a semiconductor integrated circuit including a DRAM. FIGS. 8A to 8E illustrate an example of application to a mask layout pattern for DRAM wiring in accordance with the 0.13 μm rule. FIG. 9 is a flowchart for explaining a mask pattern optimization process in the example of FIG. 8 according to the present invention. FIGS. 10A to 10D are illustrations for explaining the mask pattern optimization process.

An original mask layout pattern M121 shown in FIG. 8A comprises a line portion with a line width W112=130 nm and a pad portion (dog bone) receiving a contact plug with a diameter W111=390 nm.

In step F1 of FIG. 9, the mask pattern M12 shown in FIG. 10A is designed as an original mask layout having the desired pattern shape. When transfer is performed by using the mask layout in this state, the accuracy in transfer to a resist pattern R12 deteriorates significantly as shown in FIG. 10A.

In step F2 of FIG. 9, the original mask layout is divided for pattern extraction into large-area rectangular portions E13 and node portions E14 interconnecting the rectangular portions E13, as shown in FIG. 10B.

In step F3 of FIG. 9, the large-area rectangular portions E13 and the node portions E14 shown in FIG. 10B are separated from each other by a slit having a predetermined separation width E15 as shown in FIG. 10C. In step F4 of FIG. 9, the mask pattern is optimized into E15 according to studies based on simulation, as shown in FIG. 10D, thereby obtaining the desired transfer pattern.

The process conditions used herein are set to the wavelength $\lambda$ of exposure light=0.248 μm (KrF excimer laser), the aperture number NA of the projection lens=0.8, and the illumination diaphragm stop $\sigma$=0.5 in addition to the use of, as a mask material, a halftone phase shift mask having light transmittance of 6% only in a light shield area. A resist material used herein is a high-sensitivity positive tone film, and a defocus value is given as 0.2 μm on an assumption of the resist film has a thickness of 0.4 μm and a projected optical image is focused at the center of the resist film. Further, the width S121 (FIG. 8B) of the slit inserted between the dog bone and the node portion is given as $S121 \leq 0.682$ μm from the predetermined condition of $S121 \leq 0.22 \lambda/NA$. Because a layout data rendering grid has a pitch of 10 nm, a new mask layout M122 (FIG. 8B) is obtained by setting the slit width S121 to 60 nm with omission of the first digit.

The inventor performed a light intensity simulation based on the above-mentioned parameters to calculate a distribution of light intensity of the transferred optical image. When a mask layout M123 shown in FIG. 8C is used, the transferred optical image is produced as indicated by opt111 in FIG. 8C. The light interference is concentrated in a portion denoted by opt112 at a distance of 100 nm away from an opposing side of the dog bone, and therefore the transferred optical image is greatly narrowed in that portion. To overcome such a drawback, the minimum line width was calculated based on simulation when the height of a bias pattern M125 shown in FIG. 8D is variously changed on condition that the bias pattern M125 has a total length of 80 nm (~$0.27 \lambda/NA$), i.e., a length of 40 nm on each of the left and right sides about a line perpendicularly extending through the portion opt112 shown in FIG. 8C. As a result, the optimum height of 40 nm is obtained for the bias pattern M125 shown in FIG. 8D on condition that the image size of the portion opt112 shown in FIG. 8C takes a value of the corresponding portion in the optical image opt111 shown in FIG. 8C. Thus, a more satisfactory wiring device pattern R121 can be formed as shown in FIG. 8E by applying the slit S121 shown in FIG. 8B and the bias pattern M125 shown in FIG. 8D which are optimized based on the simulation result. The wiring device pattern R121 can provide a higher degree of rectangularity than that obtained with the prior-art mask layout correction method.

Figure 11:
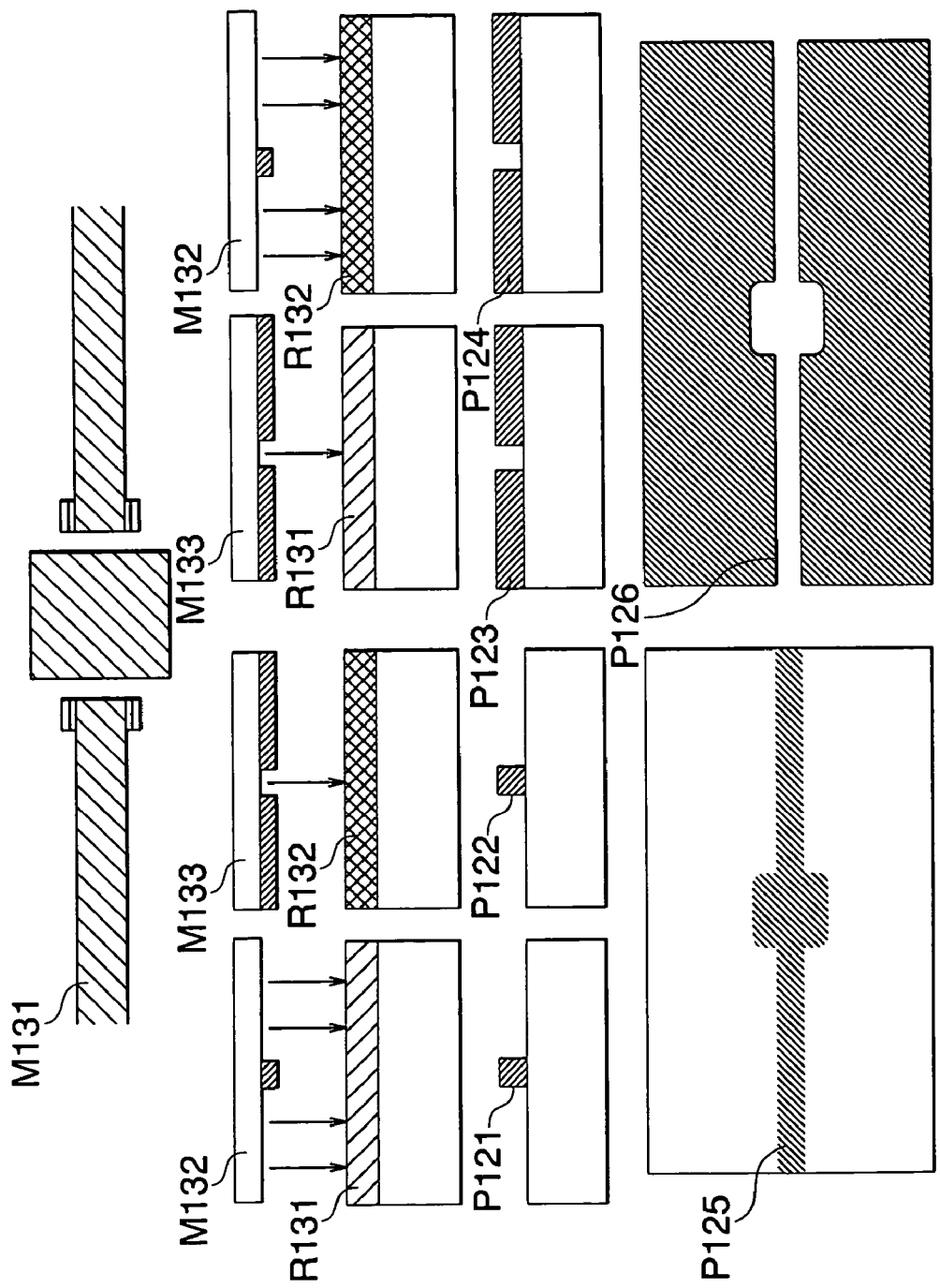
FIG. 11 is a set of illustrations for explaining another example in which the method of the present invention is applied to a device pattern.

Another example embodying the present invention will be described below with reference to FIG. 11. A wiring pattern in the form of a line having a dog-bone portion with a higher degree of rectangularity can be formed as a residual pattern (line type) or a hollowed pattern (slit type) by employing the photomask according to the present invention and utilizing a positive-tone or a negative-tone resist process as required. FIG. 11 shows the resist process in more detail.

A mask layout pattern M131 according to the present invention is prepared as a bright field mask M132 (having a light transmission area at a large proportion) and a dark field mask M133 (having a light shield area at a large proportion). Diffracted light having passed each of those masks is condensed and focused onto the surface of a resist through an optical stepper. The bright field mask M132 and the dark field mask M133 are employed for exposure of a positive tone resist R131 and a negative tone resist R132, respectively, to obtain resist patterns P121, P122 which serve as the same line pattern P125.

On the other hand, the dark field mask M133 and the bright field mask M132 are employed in combination with the positive tone resist R131 and the negative tone resist R132, respectively, to obtain resist patterns P123, P124 which serve as the same slit pattern P126.

Thus, in applications of the present invention, a wiring pattern with a higher degree of rectangularity can be selectively formed as not only a line pattern (line type), but also a slit pattern depending variations in combined use of normal and reversal masks with positive and negative tone resists. The slit pattern is useful in forming a wiring pattern by the damascene process or the dual damascene process. More specifically, when a metallic material having a difficulty in micromachining by etching is used to form multilayered wiring and gates in a semiconductor integrated circuit, the wiring pattern can be obtained through the steps of transferring a device pattern to a resist in the form of a slit pattern, etching an interlayer film with the resist slit pattern used as a mask, and filling the metallic material in an etched slit.

It is to be noted, as a matter of course, that the present invention is not limited to the above-described embodiment and examples, and can be variously altered and modified within the scope not deviating from the purport of the invention.

What is claimed is:

1. A method of manufacturing a semiconductor device including a wiring pattern in the form of a linear line having an intermediate portion with a locally different line width, the wiring pattern being formed by using a resist pattern, the method comprising:

forming the resist pattern through an exposure step using a mask pattern prepared by dividing the mask into a discontinuous pattern having a simple line portion and a separate rectangular pattern portion having a different line width, a first end of the simple line portion and a first side of the rectangular pattern portion being separated from one another by a slit having a predetermined separation width of not larger than $0.22 \times \lambda/NA$, wherein $\lambda$ represents a wavelength of exposure light, and NA represents a numerical aperture of a projection lens; and forming said wiring pattern having a continuous pattern of a simple line portion and a rectangular pattern portion, wherein:

the mask pattern further includes a bias pattern for correcting extreme narrowing of the pattern in a position of the mask layout where excessive light interference occurs, said bias pattern extending across said simple line portion and being spaced from said first end.

2. The method of manufacturing a semiconductor device according to claim 1, wherein:

in the exposure step using the mask pattern, a line pattern and a slit pattern having the same shape in the resist pattern are selectively formed by selecting a positive-tone or a negative-tone resist process.

3. The method of manufacturing a semiconductor device according to claim 1, wherein:

the portion having a different line width is a dog-bone portion.

4. The method of manufacturing a semiconductor device according to claim 1, wherein:
the portion having a different line width is an angled portion.

5. The method of manufacturing a semiconductor device according to claim 1, wherein
the line portion is a node portion.

6. A photomask used in manufacturing a semiconductor device including a continuous wiring pattern in the form of a linear line having an intermediate portion with a locally different line width, wherein:
the photomask has a mask pattern prepared by dividing the photomask into discrete portions including a simple line portion and a rectangular pattern portion having a different line width, and interposing between a first end of the line portion and a first side of the rectangular pattern portion a slit having a predetermined separation width of not larger than 0.22 ×$\lambda$/NA,
wherein $\lambda$ represents a wavelength of exposure light., and NA represents a numerical aperture of a projection lens, wherein:
the mask pattern further includes a bias pattern for correcting extreme narrowing of the pattern in a position of a mask layout where excessive light interference occurs, said bias pattern extending across said simple line portion and being spaced from said first end.

* * * * *